(12) United States Patent
Lei et al.

(10) Patent No.: US 9,123,877 B2
(45) Date of Patent: Sep. 1, 2015

(54) SINGLE-CHIP BRIDGE-TYPE MAGNETIC FIELD SENSOR AND PREPARATION METHOD THEREOF

(75) Inventors: Xiaofeng Lei, Zhangjiagang (CN); Insik Jin, Zhangjiagang (CN); James Geza Deak, Zhangjiagang (CN); Weifeng Shen, Zhangjiagang (CN); Mingfeng Liu, Zhangjiagang (CN); Songsheng Xue, Zhangjiagang (CN)

(73) Assignee: Multidimension Technology Co., Ltd. (CN)

( * ) Notice: Subject to any disclaimer, the term of this patent is extended or adjusted under 35 U.S.C. 154(b) by 0 days.

(21) Appl. No.: 14/009,834

(22) PCT Filed: Apr. 1, 2012

(86) PCT No.: PCT/CN2012/073488
§ 371 (c)(1),
(2), (4) Date: Oct. 4, 2013

(87) PCT Pub. No.: WO2012/136132
PCT Pub. Date: Oct. 11, 2012

(65) Prior Publication Data
US 2014/0021571 A1    Jan. 23, 2014

(30) Foreign Application Priority Data

Apr. 6, 2011   (CN) .......................... 2011 1 0084595
Oct. 25, 2011  (CN) .......................... 2011 1 0326762

(51) Int. Cl.
| | |
|---|---|
| H01L 29/82 | (2006.01) |
| H01L 43/02 | (2006.01) |
| G01B 7/30 | (2006.01) |
| G01R 33/09 | (2006.01) |
| G11B 5/39 | (2006.01) |
| B82Y 10/00 | (2011.01) |

(52) U.S. Cl.
CPC .................. H01L 43/02 (2013.01); B82Y 10/00 (2013.01); G01B 7/30 (2013.01); G01R 33/093 (2013.01); G11B 5/3909 (2013.01); G11B 5/3993 (2013.01); *G11B 2005/3996* (2013.01)

(58) Field of Classification Search
CPC ..... H01L 23/52; H01L 23/5386; H01L 43/04; H01L 43/06; H01L 43/08; H01L 29/82; H01L 27/22; H01L 27/224
USPC ................. 257/427, 421, 108, 414, 422, 424; 438/3
See application file for complete search history.

(56) References Cited

U.S. PATENT DOCUMENTS 7,635,974 B2 * 12/2009 Guo et al. ................. 324/207.21
8,715,776 B2 *  5/2014 Guo et al. ..................... 427/128

(Continued)

*Primary Examiner* — Thanh Y Tran
(74) *Attorney, Agent, or Firm* — Schwegman Lundberg & Woessner, P.A.

(57) ABSTRACT

The present invention discloses a design and manufacturing method for a single-chip magnetic sensor bridge. The sensor bridge comprises four magnetoresistive elements. The magnetization of the pinned layer of each of the four magnetoresistive elements is set in the same direction, but the magnetization directions of the free layers of the magnetoresistive elements on adjacent arms of the bridge are set at different angles with respect to the pinned layer magnetization direction. The absolute values of the angles of the magnetization directions of the free layers of all four magnetoresistive elements are the same with respect with their pinning layers. The disclosed magnetic biasing scheme enables the integration of a push-pull Wheatstone bridge magnetic field sensor on a single chip with better performance, lower cost, and easier manufacturability than conventional magnetoresistive sensor designs.

14 Claims, 11 Drawing Sheets

(56) References Cited

U.S. PATENT DOCUMENTS

| | | | |
|---|---|---|---|
| 2004/0165319 A1* | 8/2004 | Wan et al. | 360/324.1 |
| 2006/0039090 A1* | 2/2006 | Wan et al. | 360/324.1 |
| 2006/0039091 A1* | 2/2006 | Wan et al. | 360/324.1 |
| 2011/0037459 A1* | 2/2011 | Okada et al. | 324/207.25 |
| 2011/0309829 A1* | 12/2011 | Loreit et al. | 324/252 |

* cited by examiner

SINGLE-CHIP BRIDGE-TYPE MAGNETIC FIELD SENSOR AND PREPARATION METHOD THEREOF

CROSS-REFERENCE TO A RELATED APPLICATION

This application is a 35 U.S.C. §371 national phase application of PCT/CN2012/073488, filed on Apr. 1, 2012, which claims priority to a Chinese Patent Application No. CN201110084595, filed on Apr. 16, 2011, and a Chinese Patent Application No. CN 201110326762, filed on Oct. 25, 2011, incorporated herein by reference in its entirety.

TECHNICAL FIELD

The present invention relates to GMR and MTJ bridge sensor design and fabrication methods, in particular to a single-chip magnetic field sensor bridge and a method for preparing half-bridge, and full bridge magnetic sensors.

BACKGROUND ART

Magnetic tunnel junction (MTJ) sensors are a new type of magnetorestive sensor which has been used recently in various applications It utilizes a magnetic multilayer and the magnetoresistance effect is called tunneling magnetoresistance (TMR), The TMR effect is related to the magnetic orientation of magnetization of the ferromagnetic layers making up the magnetic multilayer, TMR is advantageous since it is a larger magnetoresistance effect than that of commonly used technologies such as anisotropic magnetoresistance (AMR) effect, giant magnetoresistance (GMR) effect, or the Hall Effect, thereby producing a larger signal, When compared to the Hall effect TMR has better temperature stability. TMR has a further advantage of high resistivity and therefore can have very low power consumption, To summarize, MTJ devices have higher sensitivity, lower power consumption, better linearity, dynamic range, wider, better temperature characteristics than AMR, GMR, or Hall devices, The resulting noise performance of TMR devices is better. In addition MTJ materials can be fabricated using existing semiconductor processes thereby providing the capability to produce MTJ sensors with very small size.

It is common to use a push-pull sensor bridge rather than a single sensor element in order to produce a magnetic field sensor, since bridge sensors have higher sensitivity, and an intrinsic temperature compensation function that suppresses drift. The traditional magnetoresistive push-pull sensor bridge requires two adjacent bridge arms in which the pinned layer magnetization is set in the opposite directions, in order to produce the push-pull effect. For low cost, it is preferable to deposit the sensor arms with opposing pinned layer magnetization direction onto the same silicon substrate. This however is not ideal for manufacturing, since there are no standard methods for setting the magnetization direction f the adjacent arms. They are usually set in the same direction. Present methods for producing push-pull bridge magnetoresistive sensors include double-deposition in which different films with different pinned layer magnetization set directions are deposited. Manufacturing is however difficult, since it is difficult to match the bridge legs, and annealing of one leg may alter the performance of the other.

Multi-chip packaging (MCP) technology may be used to produce a push-pull sensor wherein the pinned layer magnetization of the different bridge arms is set in opposite directions. When using the MCP technique, it is important to match the performance of the different sensor ships in the package. The different sensor chips in the package should come from the same silicon wafer, or they should be tested and sorted. The chips are then placed in the package where one is rotated 180 degrees from the other in order to produce a push-pull bridge. Although this technique is manufacturing friendly, temperature compensation is not as good; costs are higher due to package size and chip placement; it is difficult to properly align the chips at 180 degrees; it is difficult to match the performance of the two chips, such that there may be relatively large bias voltage asymmetries, etc. In summary, this easy manufacturing process brings in new problems. Exotic techniques such as local laser heating assisted magnetic reversal may also be used. In this method, GMR or MTJ wafers are initially annealed at high temperature in a strong magnetic field, which sets the magnetization of the different bridge arms in the same direction. At a later step in the process, a scanning laser beam plus reversed magnetic field is used to locally heat the wafer in the regions where the pinned layer needs to be reversed. Although it sounds easy in concept, the local laser heating method requires special equipment that is not commercially available, and development of the equipment is expensive. The process is also expensive to utilize, since it requires a long time to treat an entire wafer. Performance is also an issue, since it can be difficult to properly match other performance of the push and pull sensor arms that result in the process.

As illustrated above, there are few good options for producing low-cost MTJ or GMR sensor bridges using standard semiconductor processes.

SUMMARY OF THE INVENTION

The purpose of this application is to provide a single-chip magnetic field sensor bridge and a method for easily manufacturing a half and full bridge single-chip magnetic field sensors. In order to achieve above purpose, the invention provides a single chip full bridge magnetic field sensor, which comprises four magnetoresistive sensor arms, wherein each magnetoresistive element consists of one or more GMR or MTJ sensing element connected in series. Said sensing elements are constructed as a spin valve, including a magnetic free layer and a magnetic pinning layer. The magnetization of the pinning layer of all magnetoresistive elements is aligned in the same direction. All magnetoresistive elements in the sensor bridge have the same absolute value of the angle between the magnetization direction of the free layer and pinned layer magnetizations. The magnetization of the free layer of two opposite magnetoresistive elements is aligned in the same direction with the same polarity, but the magnetization direction of adjacent magnetoresistive sensor elements have opposite polarity.

The second aspect of the invention provides a method for preparing single-chip full-bridge magnetic field sensor, wherein one or more GMR or MTJ sensing elements are connected in series to form four sensor arms, the four magnetoresistive arms are connected to form a full bridge magnetic field sensor; said magnetoresistive element has a shape which provides a magnetic easy axis into which the magnetization of the free layer prefers to align.

The third aspect of the invention is to provide a method for preparing a single-chip full-bridge magnetic field sensors, wherein one or more GMR or MTJ sensing elements are respectively connected in series to form four sensor arms, and the four sensor arms are connected to form a full-bridge magnetic field sensor; there is an integrated magnet for biasing the magnetization of the free layers of the sensing elements.

The fourth aspect of the invention is to provide a method for preparing single-chip full-bridge magnetic field sensors, wherein one or more GMR or MTJ sensing elements are respectively connected in series to form four sensor arms, and the four sensor arms are connected to form a full bridge magnetic field sensor; There is an integrated conductor through which a current flows in order to produce a magnetic field that biases the magnetization direction of free layer of the magnetoresistive sensor elements, the current in said conductor flows in the same direction as the direction of magnetic moment of pinned layer of said MTJ or GMR magnetoresistive element. The fifth aspect of the invention is to provide a method for preparing single chip full bridge magnetic field sensor, wherein one or more GMR or MTJ sensing elements are respectively connected in series to form four sensor arms, and the four sensor arms are connected to form a full-bridge magnetic field sensor; the magnetic moment of said free layer is biased by the Neel-coupling field between free layer and pinned layer.

The sixth aspect of the invention is to provide a method for preparing single chip full bridge magnetic field sensor, wherein one or more GMR or MTJ sensing elements are respectively connected in series to form four sensor arms, and the four sensor arms are connected to form a full-bridge magnetic field sensor; the magnetic moment of said free layer is biased by a weak anti ferromagnetic coupling between free layer and a magnetic layer deposited on said magnetic field.

The seventh aspect of the invention is to provide a method for preparing single chip full bridge magnetic field sensor, wherein one or more GMR or MTJ sensing elements are respectively connected in series to form four sensor arms, and the four sensor arms are connected to form a full-bridge magnetic field sensor; the magnetic moment of said free layer is biased by a combination of one or more of methods in claims 8 to 12.

This invention also provides a single chip half bridge magnetic field sensor, which comprises two sensor arms, wherein each sensor arm consists of one or more GMR or MTJ sensing element connected in series, said sensing elements are configured as a spin valve, wherein each sensing element includes a free layer and a pinning layer; said two sensing arms have a pinned layer which has the magnetization aligned in the same direction, but the free layer magnetization is not aligned in the same direction; said two sensor arms have the same magnitude of the angle between the free layer magnetization direction and the pinned layer magnetization direction. This invention also provides a method for preparing a single-chip half-bridge magnetic field sensors, wherein one or more GMR or MTJ sensing elements are respectively connected in series to form two sensor arms, and the two sensor arms are connected to form a half-bridge magnetic field sensor; said magnetoresistive sensor elements have a shape with a magnetic easy axis into which the magnetization of the free layer prefers to align.

This invention also provides a method for preparing a single-chip half-bridge magnetic field sensors, wherein one or more GMR or MTJ sensing elements are respectively connected in series to form two sensor arms, and the two sensor arms are connected to form a half-bridge magnetic field sensor; there is an integrated magnet for biasing the magnetic moment of the free layer.

This invention also provides a method for preparing a single-chip half-bridge magnetic field sensors, wherein one or more GMR or MTJ sensing elements are respectively connected in series to form two sensor arms, and the two sensor arms are connected to form a half-bridge magnetic field sensor; there is an integrated current conductor which is used to bias the magnetic moment of free layer of the sensor elements, and the current of said conductor flows in the same direction as the direction of magnetic moment of pinned layer of said MTJ or GMR magnetoresistive elements.

This invention also provides a method for preparing a single-chip half-bridge magnetic field sensors, wherein one or more GMR or MTJ sensing elements are respectively connected in series to form two sensor arms, and the two sensor arms are connected to form a half-bridge magnetic field sensor; the magnetic moment of said free layer is biased by Neel-coupling field between free layer and magnetic pinning layer.

This invention also provides a method for preparing a single-chip half-bridge magnetic field sensors, wherein one or more GMR or MTJ sensing elements are respectively connected in series to form two sensor arms, and the two sensor arms are connected to form a half-bridge magnetic field sensor; the magnetic moment of said free layer is biased by a weak anti ferromagnetic coupling between free layer and a magnetic layer deposited on said magnetic field.

This invention also provides a method for preparing a single-chip half-bridge magnetic field sensors, wherein one or more GMR or MTJ sensing elements are respectively connected in series to form two sensor arms, and the two sensor arms are connected to form a half-bridge magnetic field sensor; the magnetic moment of said free layer is biased.

DESCRIPTION OF THE PREFERRED EMBODIMENTS

Figure 1:
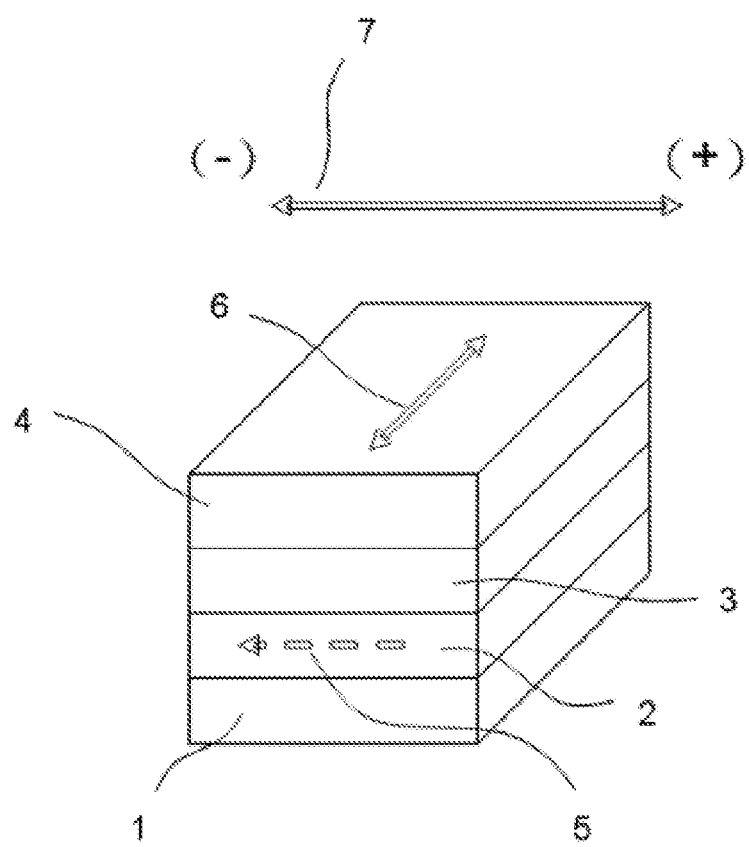
FIG. 1 is a schematic diagram of a magnetic tunnel junction structure.

The invention provides a single-chip full-bridge field sensor, which includes four sensor arms, wherein each sensor arm includes one or more GMR or MTJ sensing elements connected in series. The sensing elements are constructed as a spin valve comprising a ferromagnetic free layer and a ferromagnetic pinned layer; all sensor elements in the sensor bridge have the pinned layer magnetization set in the same direction; the magnetization of the free layer of all sensor elements in the bridge is set such that they all aligned with the same angular magnitude with respect to the pinned layer magnetization direction, but adjacent bridge arms are set such that the angle with respect to the pinned layer magnetization direction is opposite.

The magnetization direction of the free layer is controlled by the shape of the sensor element, which may be patterned into an ellipse, rectangle, or diamond.

Permanent magnets are provided in the full bridge in order to bias the direction of the free layer magnetization.

An integrated conductor is provided through which an electric current flows in order to produce a magnetic field to bias the magnetization direction of the free layer, wherein the electric current flows in the same direction as the magnetization direction of the pinned layer of the MTJ or GMR sensing elements.

Neel coupling between the free layer and the pinned layer may be used to bias the magnetization direction of the free layer.

An antiferromagnetic layer deposited on top of the free layer may be provided in order to produce a weak magnetic coupling between the antiferromagnetic layer and the free layer and thereby biases the direction of the magnetization of the free layer.

A preparation method whereby one or more GMR or MTJ sensing elements are electrically interconnected in series to produce a sensing arm, wherein the full-bridge sensor comprises four sensing arms respectively; the four GMR or MTJ sensing arms are electrically interconnected to form a Wheatstone bridge; and the GMR or MTJ sensing elements are patterned into a shape that has a magnetic easy axis, wherein the magnetization direction of a free layer points into the direction of said easy axis of said patterned magnetoresistive element.

A preparation method wherein the sensor arms formed from the GMR or TMR sensor elements are electrically interconnected to form a Wheatstone bridge and a set of permanent magnets is used to electrically bias the free layers of said sensor elements.

A method to make a single-chip full-bridge magnetic field sensor, further comprising an integrated conductor through which an electric current flows in order to produce a magnetic field to bias the magnetization direction of the free layer, wherein the electric current flows in the same direction as the magnetization direction of the pinned layer of the MTJ or GMR sensing elements.

A method to make a single-chip full-bridge magnetic field sensor utilizing GMR or MTJ elements, wherein Neel coupling between the free layer and the pinned layer biases the magnetization direction of the free layer.

A method to make a single-chip full-bridge magnetic field sensor utilizing GMR or MTJ elements, wherein a magnetic layer deposited on top of the free layer, wherein a weak antiferromagnetic coupling between the magnetic layer and the free layer biases the magnetization direction of the free layer.

A method to make a single-chip full-bridge magnetic field sensor utilizing GMR or MTJ elements, in which the method for biasing the magnetization direction of the free layer comprises a combination of one or more of the above mentioned biasing methods.

The present invention also provides a single-chip half-bridge field sensor, which includes two sensor arms, wherein each sensor arm includes one or more GMR or MTJ sensing elements connected in series. The sensing elements constructed as a spin valve, comprising a ferromagnetic free layer and a ferromagnetic pinned layer; all sensor elements in the sensor bridge have the pinned layer magnetization set in the same direction; the magnetization of the free layer of all sensor elements in the bridge is set such that they all aligned with the same angular magnitude with respect to the pinned layer magnetization direction, but adjacent bridge arms are set such that the angle with respect to the pinned layer magnetization direction is opposite.

A single-chip half-bridge magnetic field sensor, wherein the magnetization direction of the free layer of each GMR or MTJ element is parallel to an easy axis of said GMR or MTJ sensing element, and the sensor element is patterned into an ellipse, rectangle, or diamond.

A single-chip half-bridge magnetic field sensor further comprising permanent magnets to bias the magnetization direction of the free layer of the sense elements.

A single-chip half-bridge magnetic field sensor which may utilize an integrated conductor through which an electric current flows in order to produce a magnetic field to bias the magnetization direction of the free layer, wherein the electric current flows in the same direction as the magnetization direction of the pinned layer of the MTJ or GMR sensing elements.

A method to make a single-chip full-bridge magnetic field sensor utilizing GMR or MTJ elements, wherein Neel coupling between the free layer and the pinned layer biases the magnetization direction of the free layer.

A method to make a single-chip full-bridge magnetic field sensor utilizing GMR or MTJ elements, wherein a magnetic layer deposited on top of the free layer, wherein a weak antiferromagnetic coupling between the magnetic layer and the free layer biases the magnetization direction of the free layer.

A method to make a single-chip half-bridge magnetic field sensor, comprising one or more GMR or MTJ sensing elements electrically interconnected in series to produce a sensing arm, wherein the full-bridge sensor comprises four sensing arms respectively; the two GMR or MTJ sensing arms are electrically interconnected to form a half-bridge; and the GMR or MTJ sensing elements are patterned into a shape that has a magnetic easy axis, wherein the magnetization direction of a free layer points into the direction of said easy axis of said patterned magnetoresistive element.

A preparation method for a single-chip magnetic field half-bridge sensor, wherein one or more of the GMR or MTJ sensor are electrically connected in series into two magnetic resistance arms respectively. The sensor arms are connected to form a half bridge. A biasing magnet is used to set the direction of the free layers of the bridge arms.

A method to make a single-chip half-bridge magnetic field sensor, further comprising an integrated conductor through which an electric current flows in order to produce a magnetic field to bias the magnetization direction of the free layer, wherein the electric current flows in the same direction as the magnetization direction of the pinned layer of the MTJ or GMR sensing elements.

A preparation method for a single-chip magnetic field half-bridge sensor, wherein one or more of the GMR or MTJ sensor are electrically connected in series into two magnetic resistance arms respectively. The sensor arms are connected to form a half bridge. Neel coupling between the free layer and the pinned layer biases the magnetization direction of the free layer.

A preparation method for a single-chip magnetic field half-bridge sensor, wherein one or more of the GMR or MTJ sensor are electrically connected in series into two magnetic resistance arms respectively. The sensor arms are connected to form a half bridge. A magnetic layer is deposited on top of the free layer, wherein a weak antiferromagnetic coupling between the magnetic layer and the free layer biases the magnetization direction of the free layer.

A preparation method for a single-chip magnetic field half-bridge sensor, wherein one or more of the GMR or MTJ sensor are electrically connected in series into two magnetic resistance arms respectively. The sensor arms are connected to form a half bridge. The magnetization direction of the free layer of the bridge arms is biased by one or more of the above mentioned biasing techniques.

As shown in FIG. 1, the MTJ is composed of a nanoscale multilayer film comprising an antiferromagnetic pinning layer 1, magnetic pinned layer 2, a nonmagnetic insulating layer 3, and a magnetic free layer 4. The magnetic moment in pinning layer 2 is fixed in a direction 5. The magnetic moment of the free layer 4 direction can rotate in response to a magnetic field but prefers to align along axis 6 in the absence of an applied magnetic field. The direction of the magnetization of the pinned layer 5 with respect to the magnetization of the free layer 6 is close to perpendicular when no other magnetic bias is applied. The magnetization of the free layer changes in response to a magnetic field applied along the sense axis 7.

The working principle of the TMR effect is basically that the resistance of the MTJ changes as the relative angle of the direction of the magnetization 6 of the free layer 4 changes with respect to the direction of the magnetization 5 of the pinned layer 3. Because the direction of the magnetization 5 of the pinned layer 2 does not change, the direction of the magnetization 6 of the free layer 4 produces a change in resistance.

Figure 2:
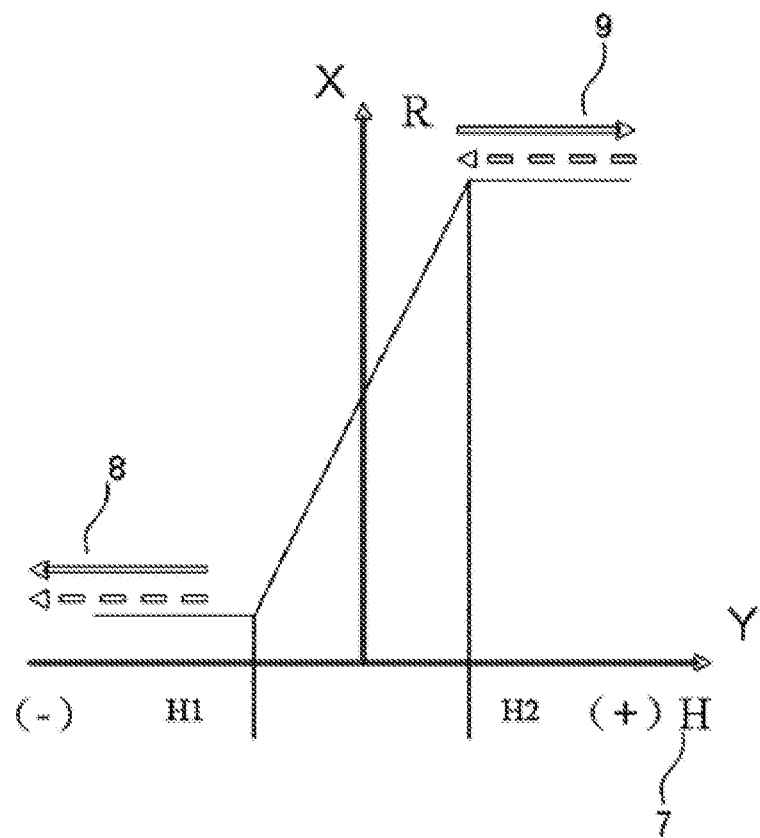
FIG. 2 illustrates the ideal resistance as a function of magnetic field response of a MTJ structure.

Shown in FIG. 2, when the direction of the applied magnetic field 7 is parallel to the direction 5 of the pinned layer 2, and the applied magnetic field 7 strength is greater than H1, the magnetization of the free layer 4 will align parallel to the pinned layer 2 magnetization direction as shown in 8, then MTJ will have minimum resistance. When the applied magnetic field 7 is antiparallel to the direction of the magnetization 5 of the pinned layer 2, and if the external magnetic field strength is greater than H2, then the magnetic moment of the free layer 4 will align in the direction of the applied magnetic field 7 in the direction antiparallel to the direction of the magnetization 5 of the pinned layer 2, as shown in 9, then the MTJ will exhibit maximum resistance. The field range between H1 and H2 is the magnetic field operating range.

Figure 3:
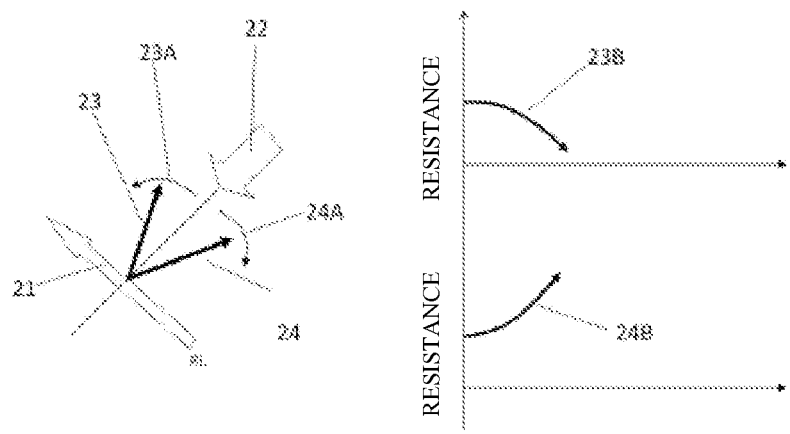
FIG. 3 shows the change in resistance of a MTJ structure in response to a magnetic field applied perpendicular to the pinned layer magnetization direction.

Shown in FIG. 3, the direction of the freelayer is free to change in response to an applied magnetic field, so the resistance changes with the applied magnetic field. For an MTJ element, the direction of magnetization of the pinned layer 21 is fixed, and the magnetic free layer 23 points to the first direction, while the magnetization of anther free layer points in a second direction 24, then the addition of an applied magnetic field 22, the magnetization in the first direction rotates as illustrated by 23A, due to applied magnetic field 22; the magnetization direction of the second free layer 24 rotates by an amount 24A. In this configuration, then for the first direction 23, because the magnetization direction of the free layer with respect to the direction of the magnetization pinned layer 21 and is reduced as shown in 23B, so the resistance is reduced. For the second direction 24, the angle of the magnetization of the free layer 2A is increased relative to the magnetization direction of the pinned layer 21, so the magnetic resistance increases, as shown in 24B.

Figure 4:
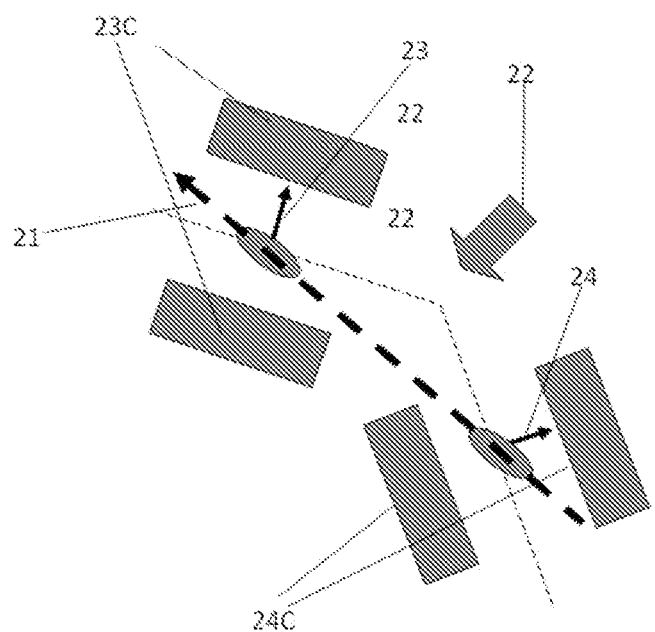
FIG. 4 shows two identical MTJs integrated on the same substrate and using permanent magnets in order to bias the free layers.

Shown in FIG. 4 an MTJ may be integrated on a chip with permanent magnet pieces 23 C which bias the direction of the magnetization of the free layer 23 to the first direction. Permanent magnet pieces 24C may be of the magnetization direction of a second free layer in a second direction 24. These magnets 23C and 24C can be applied simultaneously; such angle of the magnetization of the free layers is different.

Figure 5:
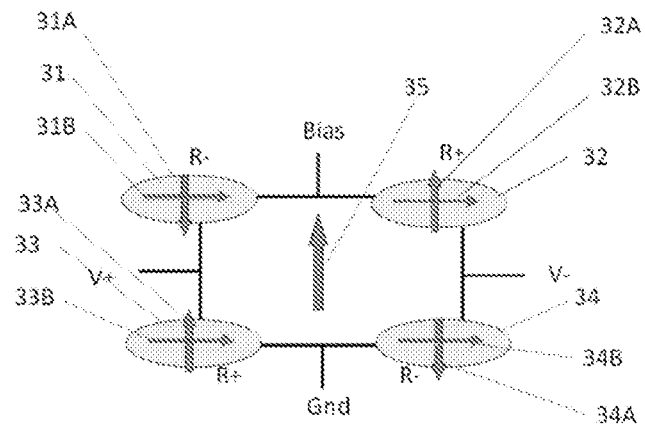
FIG. 5 is a schematic illustration of a prior art push-pull full-bridge sensor.

FIG. 5 illustrates the prior-art push-pull full bridge MTJ or GMR sensor working principle. There are four MTJ or GMR elements, namely, the first resistor 31 R−, second resistor 32 R+, a third resistor 33 R+, and a fourth resistor 34 R−. Wherein the first resistor 31 R− and the fourth resistor 34R− have parallel pinned layer magnetization directions of 31A and 34A; the second resistor 32 R+ and the third resistor 33R+ have parallel pinned layer magnetization directions of 32A and 33A; the first resistor 31R− and a first moment direction 31A points in opposition to the direction parallel to the magnetic moment 32A of the second sensor element 32 R+. In the absence of external magnetic field, the four resistors 31, 32, 33, 34 have free layer magnetization directions 31B, 32B, 33B, 34B which are all parallel to each other and perpendicular to the pinned layer magnetization directions. When a bias field is applied along direction 35, two adjacent bridge two adjacent MTJ or GMR sensors arm resistance becomes larger or smaller, respectively. That is, two bridge arms show increased resistance while two arms show decreased resistance, the combination of the different bridge arms may be used to form a push-pull full bridge magnetic field sensor. As can be seen from FIG. 5, four resistors need the pinned layer magnetization direction to be different to form a push-pull full-bridge. This is not easy to manufacture on a single-chip. For this reason, multi-chip packaging or local laser annealing are needed to produce full-bridge push-pull magnetic field sensor.

Figure 6:
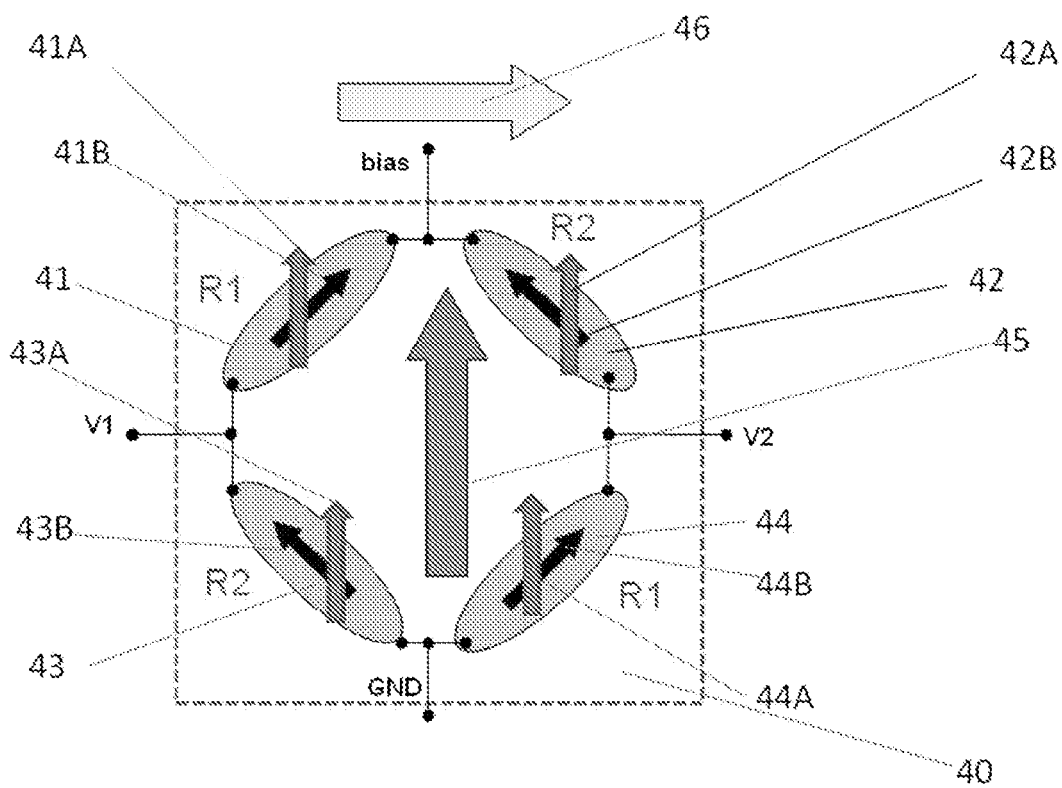
FIG. 6 illustrates one preferred implementation of a push-pull full bridge magnetic field sensor.

FIG. 6 shows the operating principle of a single-chip full-bridge push-pull magnetic field sensor. There are four MTJ or GMR sensor arms, each composed of a single magnetoresistive element and denoted as the first magnetoresistive element 41 R1, the second magnetoresistive element 42 R2, the third magnetoresistive element 43 R2, and the fourth magnetoresistive element 44 R1. For all of the sensor arms the direction of the pinned layer magnetization is the same. In each of the magnetoresistive sensor element, the magnitude of the angle between the pinned layer magnetization direction and the free layer magnetization direction is the same, but the adjacent magnetoresistive sensor elements have the free layer magnetization aligned with opposite polarity. In an optimal configuration, pinned layer magnetization directions of the four sensor arms 41A, 42A, 43A, 44A are parallel to each other and in the same direction. The magnetization direction of the first resistor and the fourth sensor arms 44 R1 and 41 R1 on opposite sides of the bridge have the same angle of the free layer magnetization 44B and 41B, which is at 45 degree angle relative to 41A, 44A pinned layer magnetization directions; the second and third sensor arms 43R2 and 42R2 are on opposite sides of the bridge from each other, and have a second and third free layer magnetization direction 43B 42B respectively, which are the same relative to the second and third pinning layer directions 42A and 43A; Likewise the magnitude of the ideal angle is 45°. In this configuration, the first sense arm 41 R1, with first magnetization direction 41B is perpendicular to the magnetization direction 42B of the second sense are 42 R2. This full-bridge sensor has pinning direction 45 for all four sense arms, and the sensitive direction 46 is perpendicular to the pinning direction 45. As can be seen by comparing FIGS. 5 and 6, because the pinned layer of all 4 sense arms is in the same direction, it is easier to build this sensor as a single-chip push pull sensor, and this is an advantage over the prior art design. There is no need for multi-chip packaging technology, and the present design does not require exotic manufacturing technology such as local laser.

Figure 7:
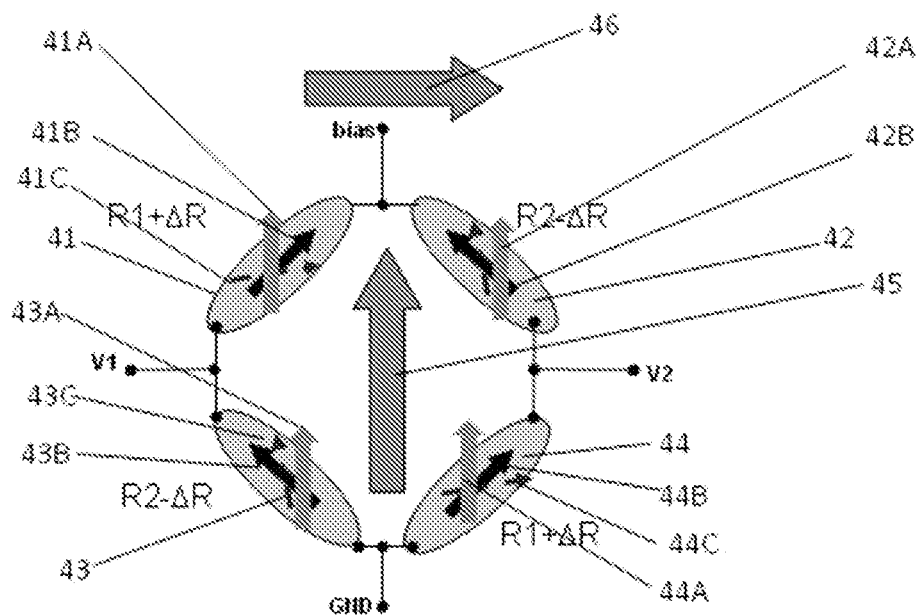
FIG. 7 illustrates the sensing direction, pinning layer direction, and magnetic moments of the free layer.

GMR or MTJ element, can use its own shape anisotropy to bias the free layer magnetization. The shape may be generally oval, rectangular, diamond, and other oblong shapes. Among the variety of shapes, usually the longitudinal direction is the easy-axis into which the free layer magnetization prefers to align. This is known as magnetic anisotropy. By adjusting the ratio of the length to the width of the shape, the magnetic anisotropy can be varied, thereby changing the input and output characteristics. Shown in FIG. 7, the sensitive direction along the external magnetic field is measured is 46, the bridge arms are resistor 41, a second resistor 42; third resistor 43, a fourth resistor 44. The resistances of adjacent arms change in opposite directions in response to the applied magnetic field, one becoming smaller and the other becoming larger. It is this characteristic of the present invention that permits the formation of a full-bridge push-pull magnetic field sensor. In particular, together with a sensitive direction along the external magnetic field of 46 forward, the first direction and the free layer 41B, the second direction 42B, the third direction 43B, and fourth direction 44B, respectively, the free layer to the new directions 41C, 42C, 43C, and 44C, respectively. Thus, the first and fourth resistors R1 and R4 into the R1+ΔR, second, third resistor R2 and R3 respectively become R2−ΔR. The output of the bridge is thus $$V1 - V2 = \frac{R2 - \Delta R - (R1 + \Delta R)}{R2 + R1} V_{bias}$$

Ideally, initial value R1=R2>ΔVbias $$V1 - V2 \approx \frac{-2\Delta R}{R2 + R1} V_{bias}$$

Thus full bridge output acquired.

Figure 8:
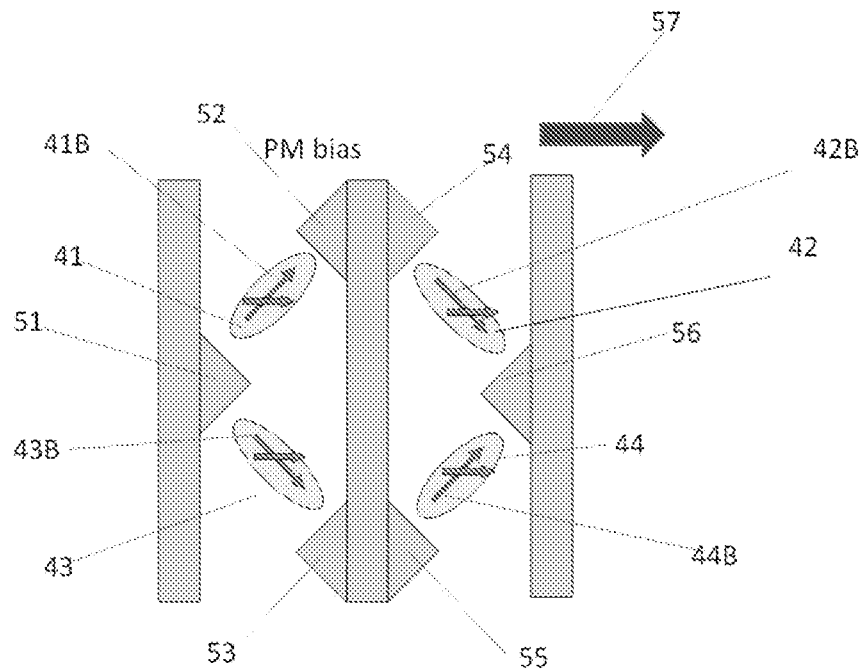
FIG. 8 shows one possible method for forming permanent magnets in order to properly bias the sensor bridge for push-pull operation.

FIG. 8 shows how magnetic moment of free layer is biased by one possible implementation of a patterned on-chip magnet sheet. The on-chip magnet sheet is magnetized by a magnetic field in direction 57. The magnet sheet produces a magnetic field along the perpendicular to the edge of magnetic sheet, the angle between the magnetic field produced by the magnet sheet and magnetizing direction 57 is less than 90° As shown in the figure, the biasing field generated by the permanent magnet pair 51 and 53 is pointing right along the long axis of the sensor element. Thus the free layer of the third resistor 43 is biased along the long axis. In the same way, the first, second and fourth resistor 41, 42 and 44 are biased by permanent magnet sheet pair 51, 52, 54, 56 and 55, 56.

Figure 9:
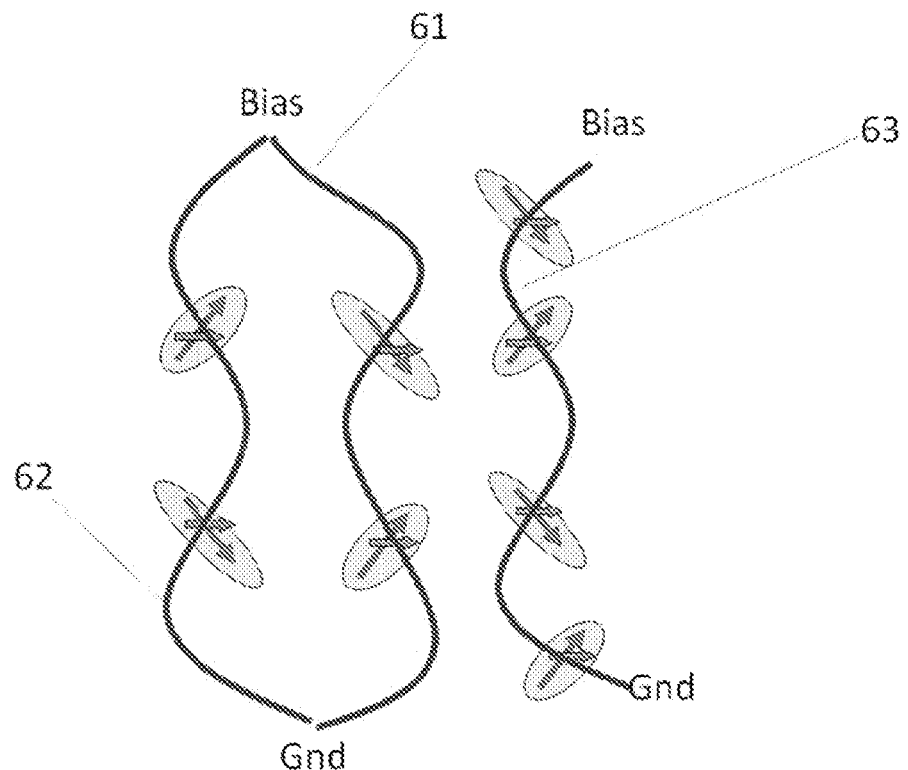
FIG. 9 shows an integrated conductor used to bias the free layer magnetization of the sensor elements.

FIG. 9 shows how free layer is biased by magnetic field produced by integrated current conductor. Current conductors 57, 58, and 59 are located right above the resistors need to be biased, and are set perpendicular to the direction in which free layer should be biased. When a biasing current is applied between Bias and Gnd, the magnetic moment of free layer can be biased in appropriate direction. There are other ways to bias the magnetic moment of free layer: using Neel-coupling field between free layer and magnetic pinning layer, using weak anti ferromagnetic coupling between free layer and a magnetic layer deposited on said magnetic free layer.

Figure 10:
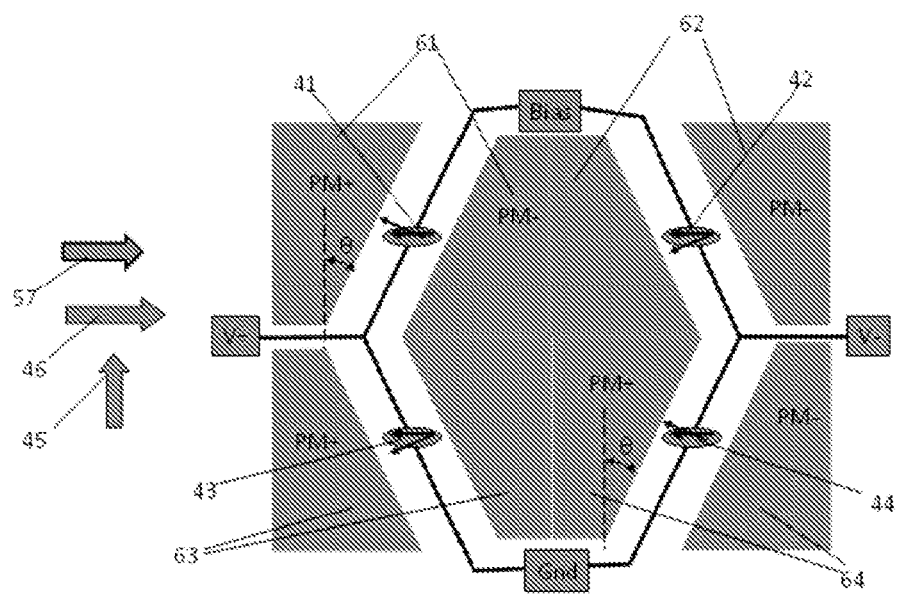
FIG. 10 shows a preferred embodiment of the push-pull full-bridge magnetic field sensor.

Shown in FIG. 10, is a preferred embodiment of a full-bridge push-pull magnetic field sensor. It consists of four sensor arms (41,42,43,44) forming a push-pull full bridge, where pinned layer magnetization direction 45 is vertically upward, sensitive direction 46 is horizontal, the magnetization direction of the permanent magnets 57 is horizontal pointing to the right. The sense elements have an elliptical shape, and the magnetic moment of the free layer without external bias magnetic field points along the easy-axis, that is the long axis of the ellipse. This full bridge includes a set of permanent magnets (61, 62). The permanent magnets can be patterned into different shapes, with a different inclination relative to the vertical direction so that an inclined angle θ, can change the resistance of the magnetoresistive elements. To adjust the sensor performance, the usual angle θ for this design ranges from 30 degrees to 60 degrees, with 45 degrees being the optimal angle, which constitutes the best performance of the magnetic field sensor full bridge. Full-bridge can be changed often pinned layer direction of the magnetic field sensor 45, the magnetization direction of the permanent magnet sheet 67, and four resistors magnetic easy axis direction relative to point to adjust the response mode. Typically, through the following three methods to align the sensor responds:

Changing the shape of magnetic free of sensor resistance layer, and can change its anisotropy, and adjust the sensor axis direction, namely for the long axis direction of the elliptical shape, for the long sides of the rectangle.

Change the sensor chip initialization direction of the permanent magnet magnetization 65.

Changing the thickness of the permanent magnet to change the bias field magnitude, the thickness of the free layers, and use different size sensor elements field to adjust the saturation field.

Figure 11:
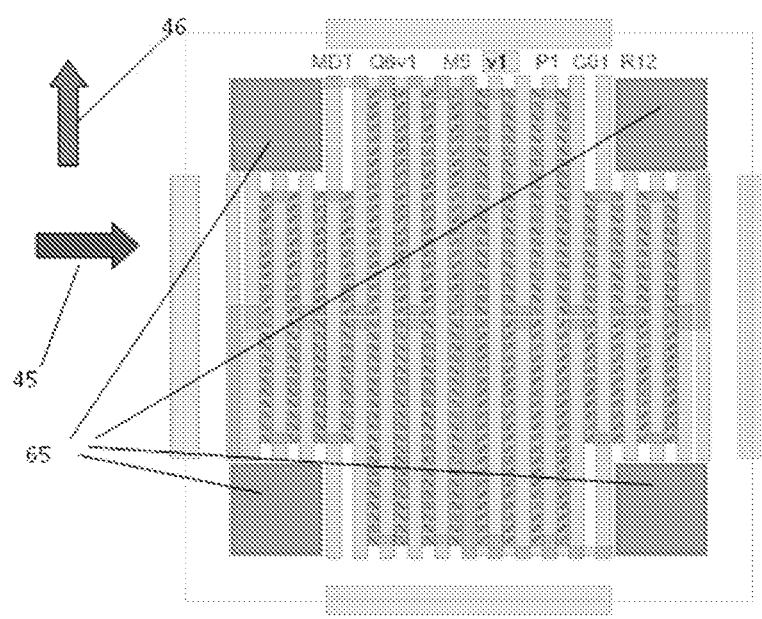
FIG. 11 illustrates an alternative single-chip embodiment of a push-pull magnetic field sensor.
Figure 12:
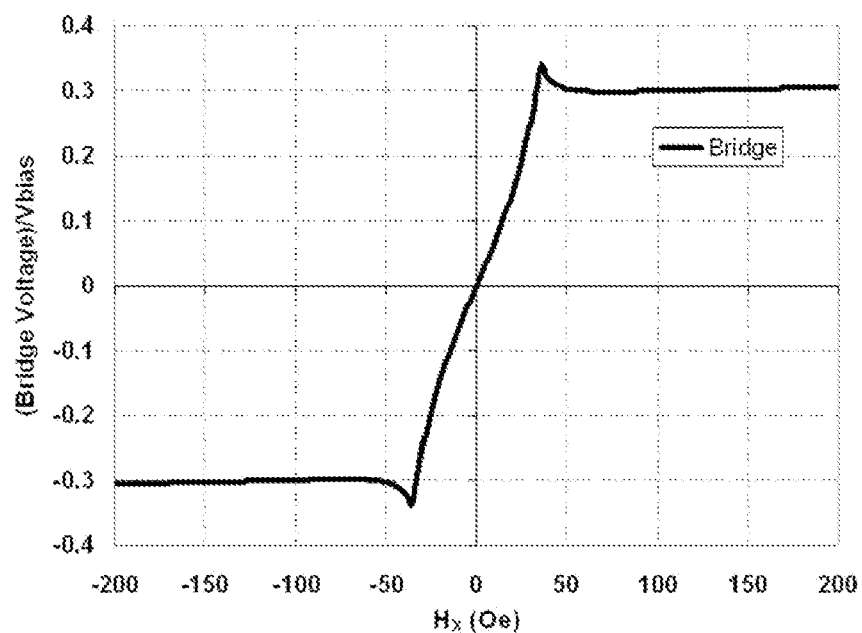
FIG. 12 illustrates the output of the sensor bridge.

FIG. 11 shows a possible implementation of a single full-bridge push-pull sensor. The pinning direction is 45, the sensing direction is 46. Each arm of the push-pull full-bridge is composed of a string of magnetic tunnel junctions element interconnected in series. Each magnetic tunnel junction element has an elliptical shape, and permanent magnets for biasing the free layer magnetization. Bond pads 65 are provided to permit a plurality of leads to be connected, in order to electrically interconnect the chip to the package lead frame or application specific integrated circuit. FIG. 12 shows the output characteristics of the design in FIG. 11.

Figure 13:
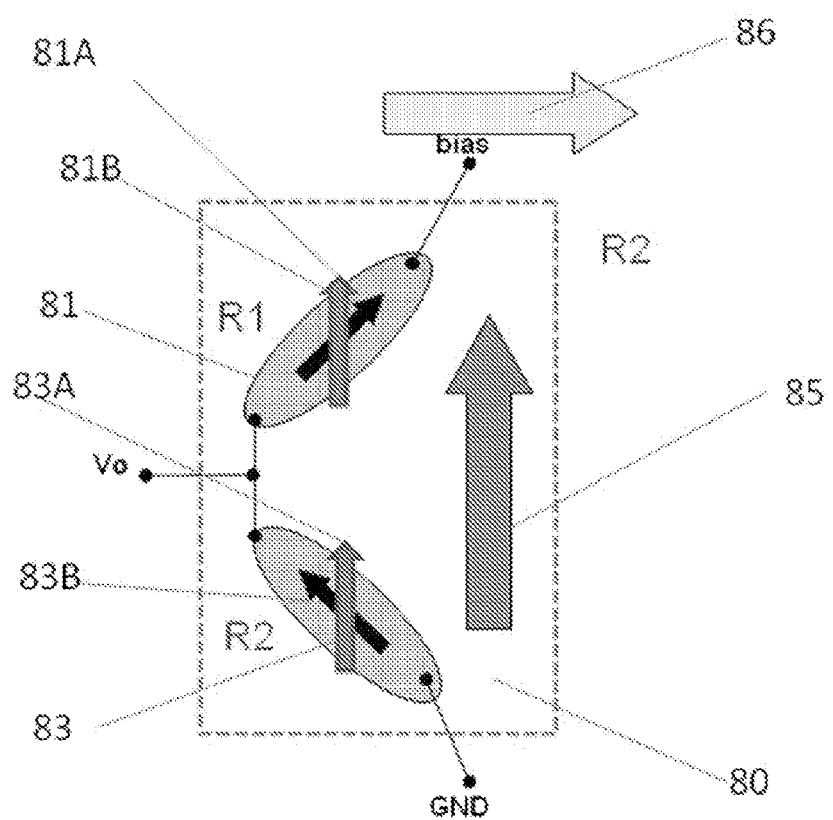
FIG. 13 illustrated the design concept for a push-pull half-bridge magnetic field sensor.

FIG. 13 is a schematic illustration of a half-bridge push-pull magnetic field sensor. The half-bridge 80 is composed of two arms, Each sensor arm consists of one or more GMR or MTJ elements connected in series, The sensor elements can be patterned into elliptical, rectangular, diamond shapes to take advantage of the shape anisotropy. The first sense arm 81 R1 and second sense arm 83 R2 have a pinned layer with magnetization directions 81A and 83A that are the same as pinning direction 85, The magnetization directions of the free layers of the first sense arm 81R1 and the second sense arm 83R2 are 81B and 83B respectively, which have an angle with respect to the pinned layer magnetization direction that has the same absolute value, but opposite polarity, The optimal magnetization angle of the magnetization of free layer 81B with respect to the pinned layer 81A has a magnitude of 45 degrees, The second free layer magnetization direction of the magnetization direction 83B is aligned at 45 degrees with respect to the second pinned layer direction 83A. The sensor is powered by applying a voltage or current between the GND and a bias, IN this configuration, a positive magnetic field aligned along 86 causes resistance of sense arm 81R1 to increase and resistance of sense arm 83R2 to decrease, reducing the output Vo. This is standard push-pull bridge operation.

Figure 14:
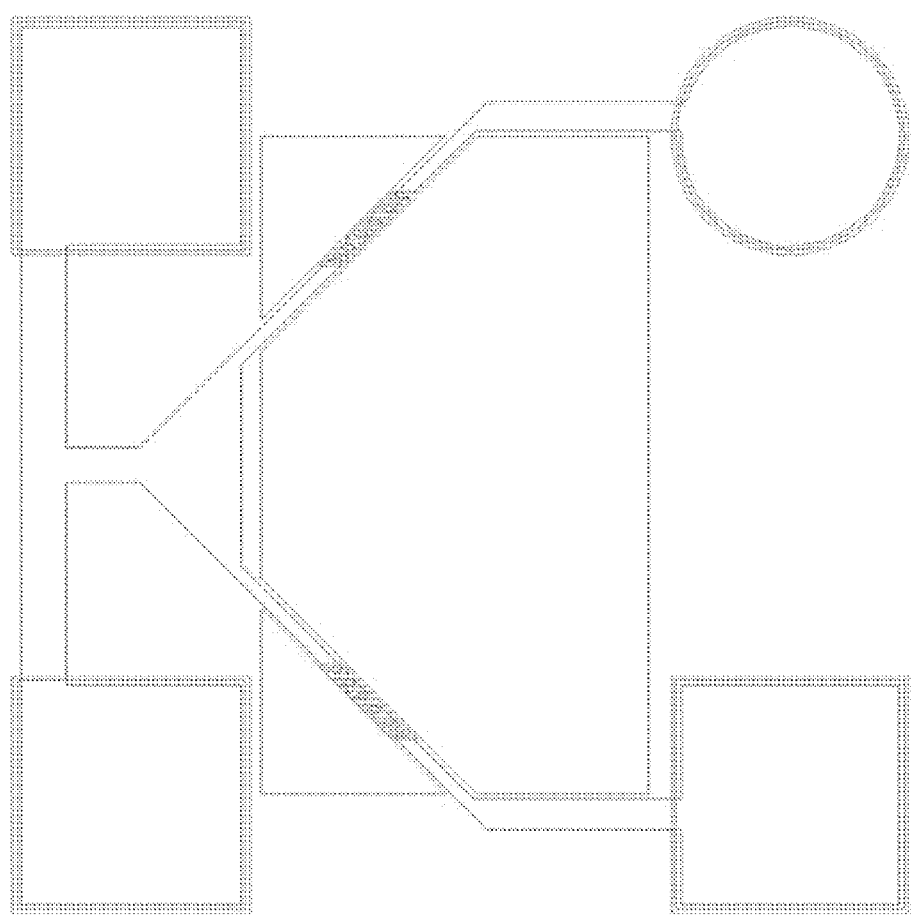
FIG. 14 illustrates one preferred embodiment of a push-pull half-bridge magnetic field sensor.

FIG. 14 illustrates one possible preferred implementation of a half-bridge push-pull magnetic field sensor. The sensor utilizes integrated magnets on chip to bias sense arms 83R2 and 81R1 such that the magnetization direction of the free layers is 81B and 83B. The pinned layer of the two sense arms points vertically in the upward direction, and the magnetic easy axis of the sense arms also points vertically in the upward direction, the bias field produced by the permanent magnet points to the right.

Figure 15:
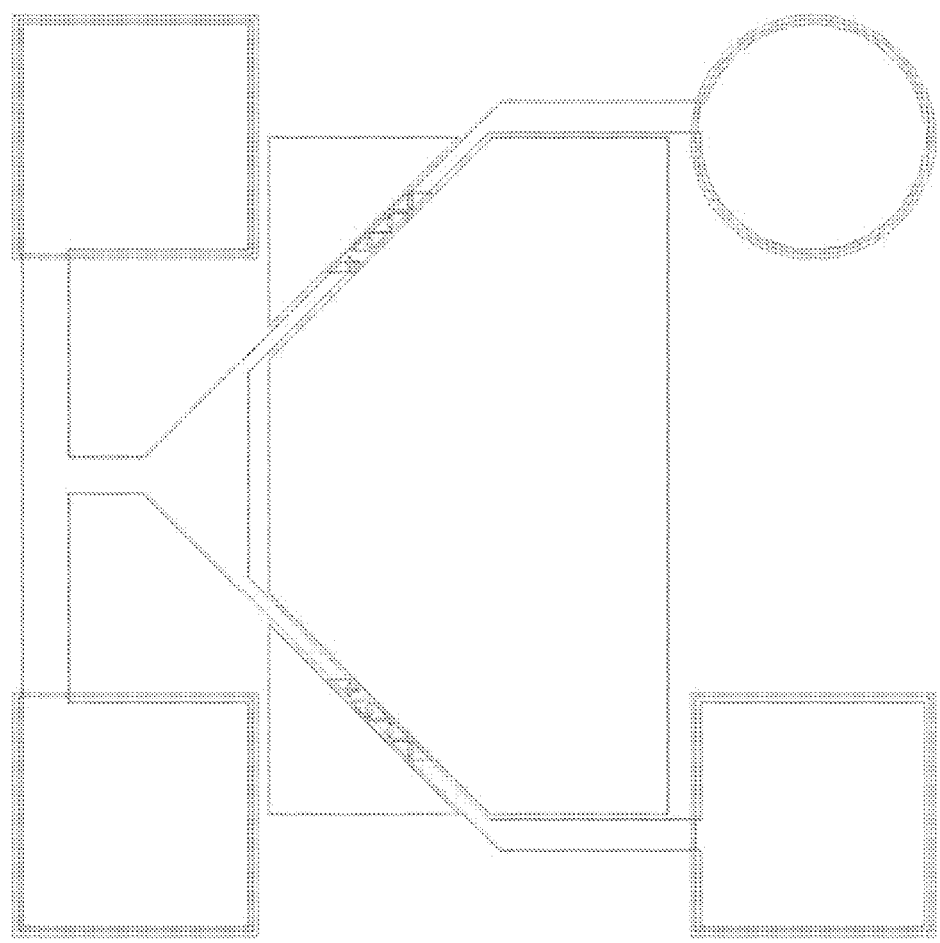
FIG. 15 shows an alternative embodiment of the push-pull half-bridge magnetic field sensor.
Figure 16:
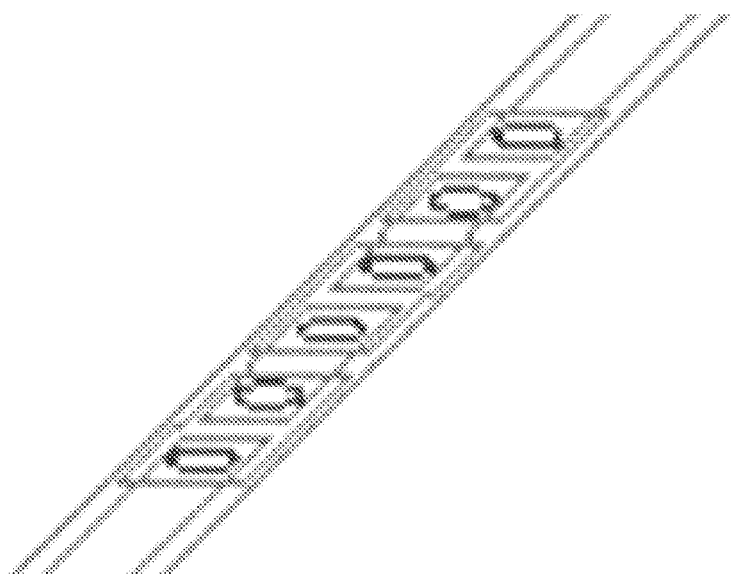
FIG. 16 shows a close up view of MTJ elements used in the sensor arms of a preferred embodiment.
Figure 17:
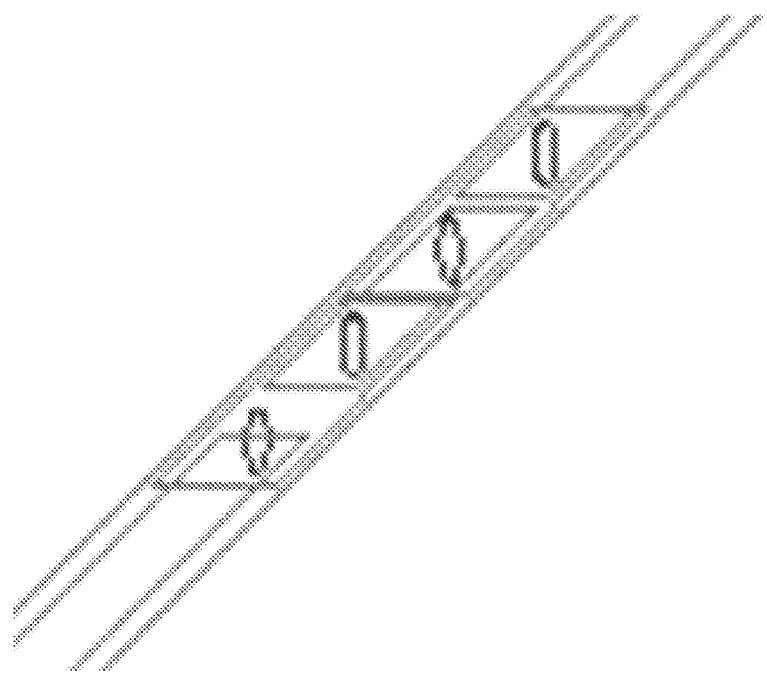
FIG. 17 shows another close up view of MTJ elements used in the sensor arms of a different preferred embodiment.

FIG. 15 shows another possible preferred embodiment of the half-bridge push-pull magnetic field sensor. Shown in the figure are integrated on chip permanent magnets used to bias sense arms 83R2 and 81R1 such that the free layers of the sense arms have orientations 81B and 83B respectively. The pinning direction for both sense arms points vertically upward, The magnetic easy axis of the sense arms also points in the vertically direction, The magnet is set in the vertical direction, and the sensitive direction is horizontal.

Although a few embodiments of the present invention have been described, it would be appreciated by those skilled in the art that changes may be made in these embodiments without departing from the principles and spirit of the present invention, the scope of which is defined in the claims and their equivalents.

The invention claimed is:

1. A single-chip magnetic field sensor bridge, comprising
   four or two magnetoresistive sensor arms, each of which includes one or more giant magnetoresistance or magnetic tunnel junction magnetoresistive sensing elements;
   each giant magnetoresistance or magnetic tunnel junction magnetoresistive sensing element is configured as a spin-valve comprising a free layer and a pinned layer;
   the magnetization direction of the pinned layer of each giant magnetoresistance or magnetic tunnel junction magnetoresistive sensing element is set in the same direction;
   an angle describing the orientation of the magnetization of the free layer of each giant magnetoresistance or magnetic tunnel junction magnetoresistive sensing element, such that in the absence of an applied magnetic field, all free layers have a magnetization that is oriented at the angle having the same absolute value;
   the magnetization directions of the free layers of adjacent giant magnetoresistance or magnetic tunnel junction magnetoresistive sensing elements in adjacent sensor arms always have a different polarity with respect to the pinned layer magnetization direction; and
   a bond pad for electrically interconnecting a sensor chip with an application specific integrated circuit or semiconductor package leadframe.

2. A single-chip magnetic field sensor bridge as claimed in claim 1, wherein the magnetization direction of the free layer of each giant magnetoresistance or magnetic tunnel junction magnetoresistive sensing element is parallel to an easy axis of said giant magnetoresistance or magnetic tunnel junction sensing element, and the giant magnetoresistance or magnetic tunnel junction magnetoresistive sensing element is patterned into an ellipse, rectangle, or diamond.

3. A single-chip magnetic field sensor bridge as claimed in claim 1, further comprising permanent magnets to bias the magnetization direction of the free layer of the magnetic tunnel junction or giant magnetoresistance magnetoresistive sensing elements.

4. A single-chip magnetic field sensor bridge as claimed in claim 1, further comprising an integrated conductor through which an electric current flows in order to produce a magnetic field to bias the magnetization direction of the free layer, wherein the electric current flows in the same direction as the magnetization direction of the pinned layer of the magnetic tunnel junction or giant magnetoresistance magnetoresistive sensing elements.

5. A single-chip magnetic field sensor bridge as claimed in claim 1, wherein Neel coupling between the free layer and the pinned layer biases the magnetization direction of the free layer.

6. A single-chip magnetic field sensor bridge as claimed in claim 1, further comprising a permanent magnetic layer deposited on top of the free layer, wherein the permanent magnetic layer provides a field to biases the magnetization direction of the free layer.

7. A single-chip magnetic field sensor bridge as in claim 1, where said four sensing arms are interconnected as a full bridge, and the polarity of the angle of orientation of the magnetization of the free layers of the giant magnetoresistance or magnetic tunnel junction magnetoresistive sensing elements in the sensor arms located diagonally across from each other on the sensor chip always have the same polarity with respect to the pinned layer magnetization direction.

8. A single-chip magnetic field sensor bridge as in claim 1, where said two sensing arms are interconnected as a half bridge.

9. A method to make a single-chip magnetic field sensor bridge, comprising the steps of:
   interconnecting one or more giant magnetoresistance or magnetic tunnel junction magnetoresistive sensing elements electrically in series to produce four or two sensor arms;
   interconnecting the four sensor arms or two sensor arms electrically in order to form a full-bridge or half bridge respectively;
   patterning the giant magnetoresistance or magnetic tunnel junction magnetoresistive sensing elements into a shape that has a magnetic easy axis;
   magnetically biasing the sensor arms to force the magnetization of free layers out of the magnetic easy axis direction, such that half of the free layers are oriented at a positive angle with respect to a pinned layer magnetization direction, and the other half of the free layers are oriented at a negative angle with respect to the pinned layer magnetization direction, wherein the magnitude of said positive angle and said negative angle is the same for all bridge arms;
   interconnecting the sensor arms to produce the sensor bridge; and
   electrically interconnecting a sensor chip with an application specific integrated circuit or semiconductor package leadframe.

10. A method to make a single-chip magnetic field sensor bridge as claimed in claim 9, using a set of permanent magnets magnetically to bias the free layers of said giant magnetoresistance or tunneling magnetoresistance magnetoresistive sensing elements.

11. A method to make a single-chip magnetic field sensor bridge as claimed in claim 9, further comprising a step of integrating a conductor through which an electric current flows in order to produce a magnetic field to bias the magnetization direction of the free layer.

12. A method to make a single-chip magnetic field sensor bridge as claimed in claim 9, wherein Neel coupling between the free layer and the pinned layer biases the magnetization direction of the free layer.

13. A method to make a single-chip magnetic field sensor bridge as claimed in claim 9, further comprising a step of depositing a permanent magnetic layer on top of the free layer, wherein the permanent magnetic layer provides a magnetic field that biases the magnetization direction of the free layer.

14. A method to make a single-chip full-bridge magnetic field sensor bridge as claimed in claim 9, further comprising a step of biasing the magnetization direction of the free layer by a combination of the biasing methods stated in claim 8-11.

* * * * *